(12) United States Patent
Lan (10) Patent No.: US 11,990,479 B2
(45) Date of Patent: May 21, 2024

(54) PIXEL STRUCTURE AND DISPLAY DEVICE

(71) Applicant: Xiamen Tianma Micro-Electronics Co., Ltd., Xiamen (CN)

(72) Inventor: Xuexin Lan, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 33 days.

(21) Appl. No.: 17/515,711

(22) Filed: Nov. 1, 2021

(65) Prior Publication Data

US 2022/0059575 A1 Feb. 24, 2022

Related U.S. Application Data

(63) Continuation of application No. 15/413,273, filed on Jan. 23, 2017, now abandoned.

(30) Foreign Application Priority Data

Sep. 12, 2016 (CN) .......................... 201610816672.9

(51) Int. Cl.
*H01L 27/12* (2006.01)
*G02F 1/1362* (2006.01)
*G02F 1/1368* (2006.01)
*H01L 29/786* (2006.01)

(52) U.S. Cl.
CPC .... *H01L 27/1233* (2013.01); *G02F 1/136286* (2013.01); *G02F 1/1368* (2013.01); *H01L 27/124* (2013.01); *H01L 27/1255* (2013.01); *H01L 29/78645* (2013.01); *H01L 29/78648* (2013.01); *H01L 29/78672* (2013.01); *H01L 29/78696* (2013.01); *G02F 2202/104* (2013.01)

(58) Field of Classification Search
CPC ............... H01L 27/1233; H01L 27/124; H01L 27/1255; H01L 29/78645; G02F 1/136286; G02F 1/1368
USPC .......................................................... 257/72
See application file for complete search history.

(56) References Cited

U.S. PATENT DOCUMENTS

| 6,610,997 B2 * | 8/2003 | Murade ............... H01L 27/1255 257/E27.113 |
| 2010/0025692 A1 * | 2/2010 | Hsiao ............... H01L 29/42384 257/E33.053 |

* cited by examiner

*Primary Examiner* — Ori Nadav
(74) *Attorney, Agent, or Firm* — KILPATRICK TOWNSEND & STOCKTON LLP (57) ABSTRACT

The present application discloses a pixel structure and a display device. The pixel structure includes a scan line having a branch structure; and a semiconductor pattern intersecting with the scan line and the branch structure. The semiconductor pattern includes: a first channel region disposed below the scan line; a second channel region disposed below the branch structure; and doping regions respectively disposed at two sides of the first channel region and at two sides of the second channel region. Wherein, the width of the second channel region is less than the width of the first channel region. The pixel structure may improve the display performance of the display screen.

17 Claims, 11 Drawing Sheets

Fig. 1

Prior Art

PIXEL STRUCTURE AND DISPLAY DEVICE

CROSS REFERENCE

This application is a continuation application of U.S. patent application Ser. No. 15/413,273, which is based upon and claims priority to Chinese Patent Application No. 201610816672.9, filed on Sep. 12, 2016, the entire contents thereof are incorporated herein by reference.

FIELD

The present disclosure relates to the field of crystal displays, and more particularly to a pixel structure and a display device.

BACKGROUND

With the rapid development of display technology, high PPI (Pixels Per Inch), and even ultra-high PPI has become an inevitable trend. Image resolution is generally expressed in PPI (number of pixels per inch), and the higher the PPI value is, the higher the density of the display screen (pixels) for displaying an image is. The higher the PPI of the display is, the more detail a displayed image will contain, and the higher the fidelity will be. However, with the improvement of the PPI of the screen, more and more closely pixels will be arranged, the size of each pixel has to become smaller and smaller, which not only poses great challenges to the design of the device, but also leads to many difficulties.

Figure 1:
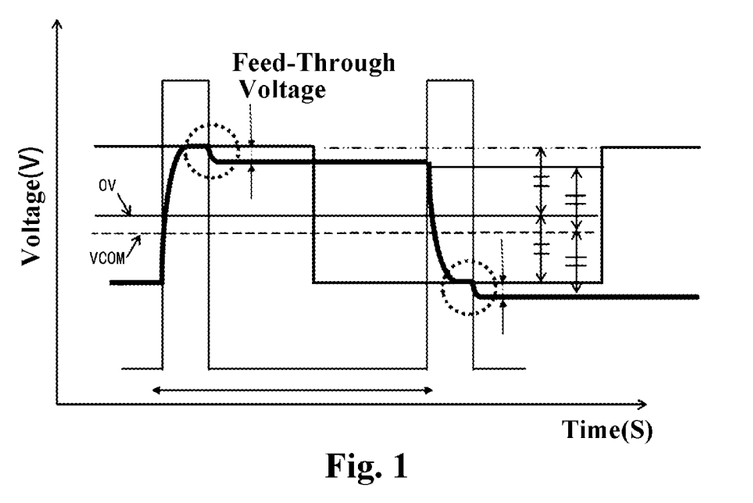
FIG. 1 schematically illustrates a graph of how a feed-through voltage influences charging capability of a pixel.

Among many problems that restrict the high PPI technology, insufficient charging capacity is one of the reasons that challenge the high PPI technology. The main factors that restrict the high-PPI charging capacity may be: a heavy load of a LCD panel, a short pixel charging time, existence of a feed-through voltage and a limited width-to-length ratio of the pixel, and so on, in which the feed-through is important to the high PPI technology with a small pixel storage capacitance (less than 32 fF) as shown in FIG. 1.

There are several methods for reducing the feed-through voltage of the pixel: reducing a width of the pixel structure and a width of a channel of the pixel structure, reducing a capacitance of a gate oxide layer in the pixel structure, reducing a voltage difference of a thin-film transistor (TFT) when the liquid crystal screen is turned on and turned off, and increasing the storage capacitance of the pixel structure, and so on. However, for a high-PPI product, since a pitch between pixels is very small, it is difficult to increase the storage capacitance of the pixel structure. While reducing the width of the channel of the pixel structure or reducing the voltage difference of the thin-film transistor (TFT) when the liquid crystal screen is turned on and turned off means further reducing the charging capability. Reducing the capacitance of the gate oxide layer of the pixel structure means increasing the thickness of the film or reducing the dielectric coefficient. This goes away from the trend of miniaturization of the device, and this will reduce the current of the device in a turned-on state. As a result, it will reduce the charging capacity. Reducing the width of the channel of the pixel structure can reduce the feed-through voltage and improve the charging capability. However, it will bring about other problems such as increased gate delay and unequal charging capability on the left side and on the right side of the panel.

Therefore, a method and a structure for reducing a feed-through voltage are demanded.

The above-mentioned information disclosed in the background section is only for the purpose of enhancing the understanding of the background and thus it may include information which does not constitute prior art known to those of ordinary skill in the art.

SUMMARY

The present disclosure provides a pixel structure, which can lower the feed-through voltage without increasing gate delay. It may improve the charge capacity of the device and it may improve the display performance of the display screen.

Other characteristics and advantages of the present disclosure may become apparent from the following detailed description, and may be partly learned by practicing the present disclosure.

According to one embodiment of the present disclosure, there is provided a pixel structure, including a scan line having a branch structure; and a semiconductor pattern intersecting with the scan line and the branch structure. The semiconductor pattern includes: a first channel region corresponding to the scan line; a second channel region corresponding to the branch structure; and doping regions respectively disposed at two sides of the first channel region and at two sides of the second channel region, wherein a width of the second channel region is less than a width of the first channel region.

According to the pixel structure of the present disclosure, the feed-through voltage may be lowered without increasing gate delay. Moreover, the charge capacity of the device may be enhanced, and it may improve the display performance of the display screen.

It should be understood that the above general description and the detailed description below are merely illustrative, rather than limiting the present disclosure.

BRIEF DESCRIPTION OF THE DRAWINGS

The above and other objectives, features and advantages of the present disclosure will become more apparent from exemplary embodiments thereof which are described in detail with reference to accompanying drawings.

DETAILED DESCRIPTION

Now, the exemplary embodiments will be described fully with reference to the accompanying drawings. However, the exemplary embodiments may be implemented in various forms, and should not be understood as being limited to the examples set forth herein. Instead, these embodiments are provided to make the present disclosure more thorough and complete, and to fully convey the concept of the exemplary embodiments. The accompanying drawings are merely schematic illustration of the present disclosure, and may not be depicted in scale. Like reference numbers throughout the drawings represent same or similar components, and the description thereof will be omitted.

In addition, the features, structures or characteristics described herein may be combined in one or more embodiments with a proper manner. In the description below, many specific details are given for through understanding of the embodiments described in the present disclosure. However, embodiments of the present disclosure may be practiced without one or more of the particular details, or may utilize other components, device, etc. In other situations, structures, devices, materials which are well known will not be illustrated or described in detail to avoid obscuring the embodiments of the present disclosure.

Figure 2:
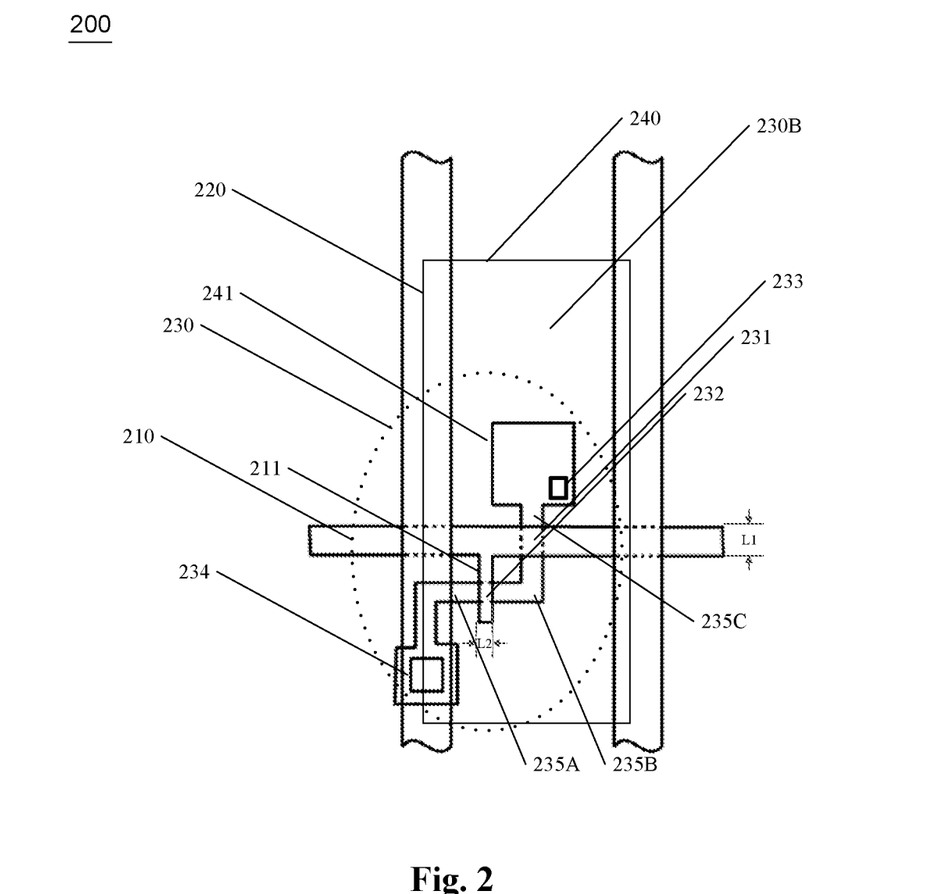
FIG. 2 is a schematic diagram of a pixel structure according to an exemplary embodiment in accordance with the present disclosure.

FIG. 2 is a schematic diagram of a pixel structure according to an exemplary embodiment in accordance with the present disclosure.

As shown in FIG. 2, a pixel structure 200 according to an exemplary embodiment includes a scan line 210, a data line 220 intersecting with the scan line 210, a semiconductor pattern 230 and a transparent pixel electrode 240. The pixel structure 200 may be disposed on a substrate (not shown). In FIG. 2, the semiconductor pattern 230 is disposed below the scan line 210, and the data line 220 is disposed below the scan line 210. However, the present disclosure is not limited thereto.

The semiconductor pattern 230 also includes a drain-electrode contact 233 and a source-electrode contact 234.

As shown in FIG. 2, the scan line 210 has a branch structure 211. The branch structure 211 extends vertically from the scan line 210. However, the present disclosure is not limited thereto.

The semiconductor pattern 230 intersects respectively with the scan line 210 and the branch structure 211. The semiconductor pattern 230 includes a first channel region 231 which corresponds to the scan line 210, a second channel region 232 which corresponds to the branch structure 211, doping regions 235A, 235B and 235C respectively on the two sides of the first channel region 231 and on the two sides of the second channel region 232.

As shown in FIG. 2, the first channel region 231, the second channel region 232 and the doping regions 235A, 235B and 235C as well as the portions of the scan line 210 and the branch structure 211 to which the first channel region 231, the second channel region 232 correspond may be configured to form a multi-channel (multi-gate) thin-film transistor 230.

According to an exemplary embodiment, an asymmetric double gate (or multi-gate) structure is provided. For example, as shown in FIG. 2, the branch structure 211 intersecting with the semiconductor pattern 230 has a width L2 less than a width L1 of the scan line 210. Since the first channel region 231 corresponds to the scan line 210, the first channel region 231 has a width equal to the width L1 of the scan line 210. In the present embodiment, L1 represents the width of the first channel region 231 or the width of the scan line 210. Since the second channel region 232 corresponds to the branch structure 211, the second channel region 232 has a width equal to the width L2 of the branch structure 211. In the present embodiment, L2 represents the width of the second channel region 232 or the width of the branch structure 211. That is, the width of the second channel region 232 is less than the width of the first channel region 231. Therefore, the width of another channel region may be reduced without changing the width of the scan line. By so doing, the stray capacitance may be reduced and the feed-through voltage may be lowered without increasing gate delay.

In embodiments in accordance with the present disclosure, the width mentioned herein is merely for easy description, rather than limiting the present disclosure. In the embodiments of the present disclosure, the terms "length" and "width" may be interchangeable.

In some embodiments, the width of the second channel region 232 is L2 as shown in FIG. 2, which may be ⅕ to ⅘ of L1 as shown in FIG. 2, where L1 is the width of the first channel region 231. This can achieve desirable balance between performance and cost. It should be understood that the present disclosure is not limited thereto, and the width of the second channel region 232 may be smaller. As long as the manufacturing technology permits and won't cause the TFT device to fail, the width of the second channel region 232 may be even smaller.

In some embodiments, the semiconductor pattern 230 may be made of polysilicon material, for example. That is, the semiconductor pattern 230 may be a polysilicon pattern.

In an exemplary embodiment, as shown in FIG. 2, the pixel structure 200 may also include the drain-electrode contact 233 and the source-electrode contact 234. The data line 220 may be electrically connected to the source-electrode contact 234. The transparent pixel electrode 240 may be electrically connected to the drain-electrode contact 233.

In an exemplary embodiment, as shown in FIG. 2, the semiconductor pattern 230 may also include a capacitor electrode 237.

In an exemplary embodiment, the width L2 of the second channel region 232 is smaller than the width L1 of the first channel region 231. This may effectively reduce the stray capacitance in the pixel structure. Therefore, the pixel structure in the exemplary embodiment may be applicable to situation where the pixel structure has a small width and the pixel storage capacitance is low. For example, in some embodiments, the width of the pixel structure may be less than 15 um. As another example, in some embodiments, the value of the pixel storage capacitance may be less than 150 fF. This is difficult to be achieved with conventional technology. Therefore, the pixel structure of this embodiment in accordance with the present disclosure is applicable to high PPI technology which has low pixel storage capacitance. It can effectively improve the charging capacity of a high-PPI display screen, and in turn, may improve the overall performance of the display.

Figure 3:
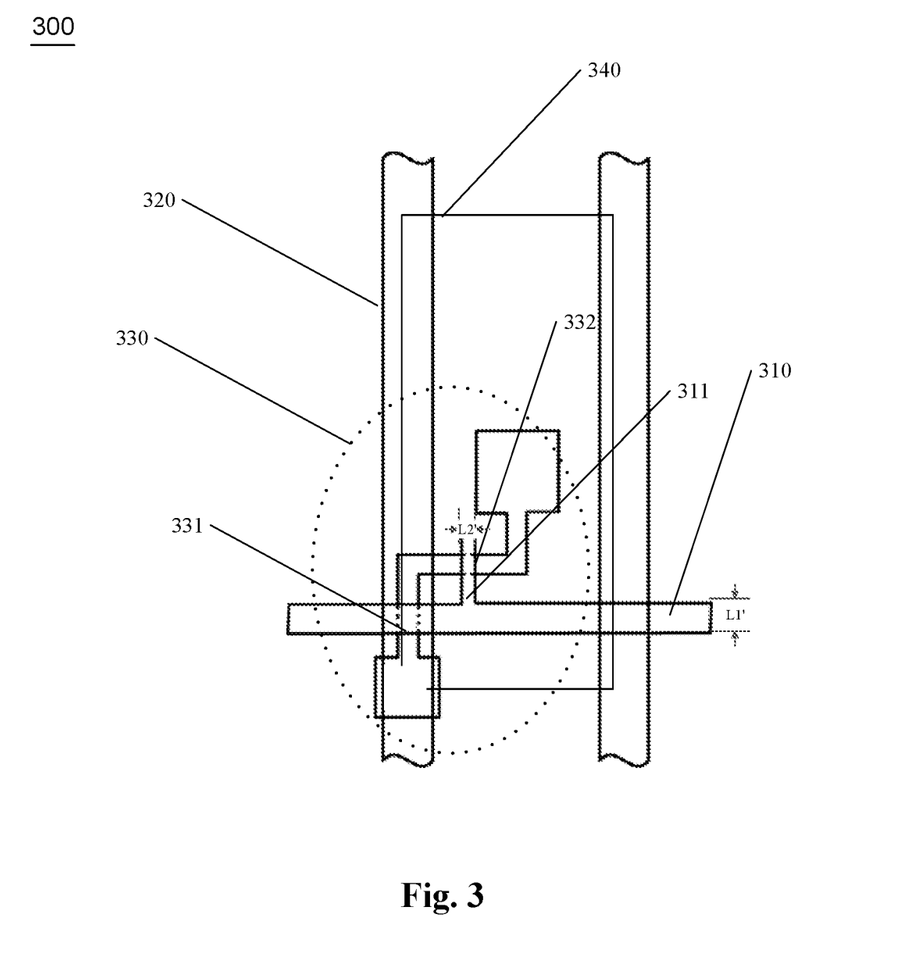
FIG. 3 is a schematic diagram of a pixel structure according to another exemplary embodiment in accordance with the present disclosure.

FIG. 3 is a schematic diagram of a pixel structure according to another exemplary embodiment in accordance with the present disclosure.

As shown in FIG. 3, a pixel structure 300 includes a scan line 310, a data line 320, a semiconductor pattern 330 and a transparent pixel electrode 340.

The pixel structure of the exemplary embodiment as shown in FIG. 3 is substantially the same with the pixel structure as shown in FIG. 2, except that the semiconductor pattern 330 and the extending directions of the scan line 310 and the branch structure 311 are different from those shown in FIG. 2. In this regard, the semiconductor pattern 330 includes: a first channel region 331 which corresponds to the scan line 310 and a second channel region 332 which corresponds to the branch structure 311.

Figure 4:
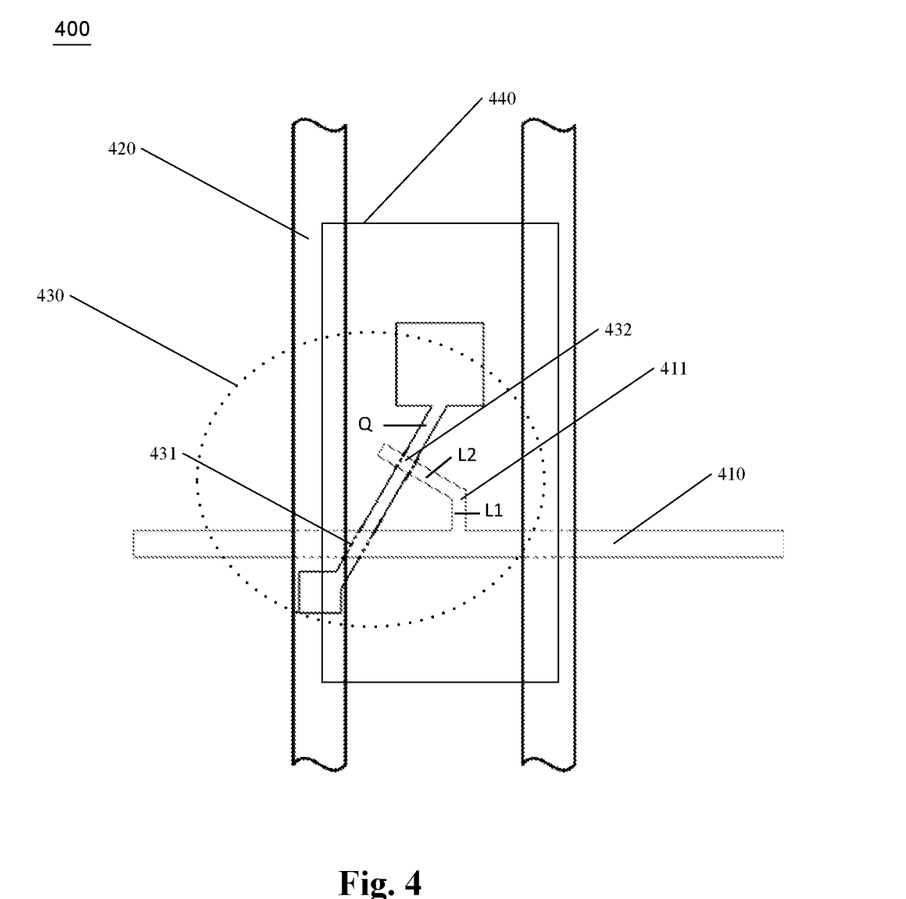
FIG. 4 is a schematic diagram of a pixel structure according to another exemplary embodiment in accordance with the present disclosure.

FIG. 4 is a schematic diagram of a pixel structure according to another exemplary embodiment in accordance with the present disclosure.

As shown in FIG. 4, a pixel structure 400 includes a scan line 410, a data line 420, a semiconductor pattern 430 and a transparent pixel electrode 440. FIG. 4 differs from FIG. 2 in that the branch structure 411 is of an "L" shape and the semiconductor pattern 430 includes a linear portion Q. In FIG. 4, a second part L2 of the L-shaped branch structure 411 intersects with a first part L1 of the L-shaped branch structure 411, and the second part L2 of the L-shaped branch structure 411 perpendicularly intersects with a linear part Q of the semiconductor pattern 430. However, the present disclosure is not limited thereto. The semiconductor pattern 430 intersects with the scan line 410 and the branch structure 411 respectively. In this regard, the semiconductor pattern 430 includes: a first channel region 431 which corresponds to the scan line 410 and a second channel region 432 which corresponds to the branch structure 411. Description of the parts in FIG. 4 which are the same as in FIG. 2 will not be repeated.

Figure 5:
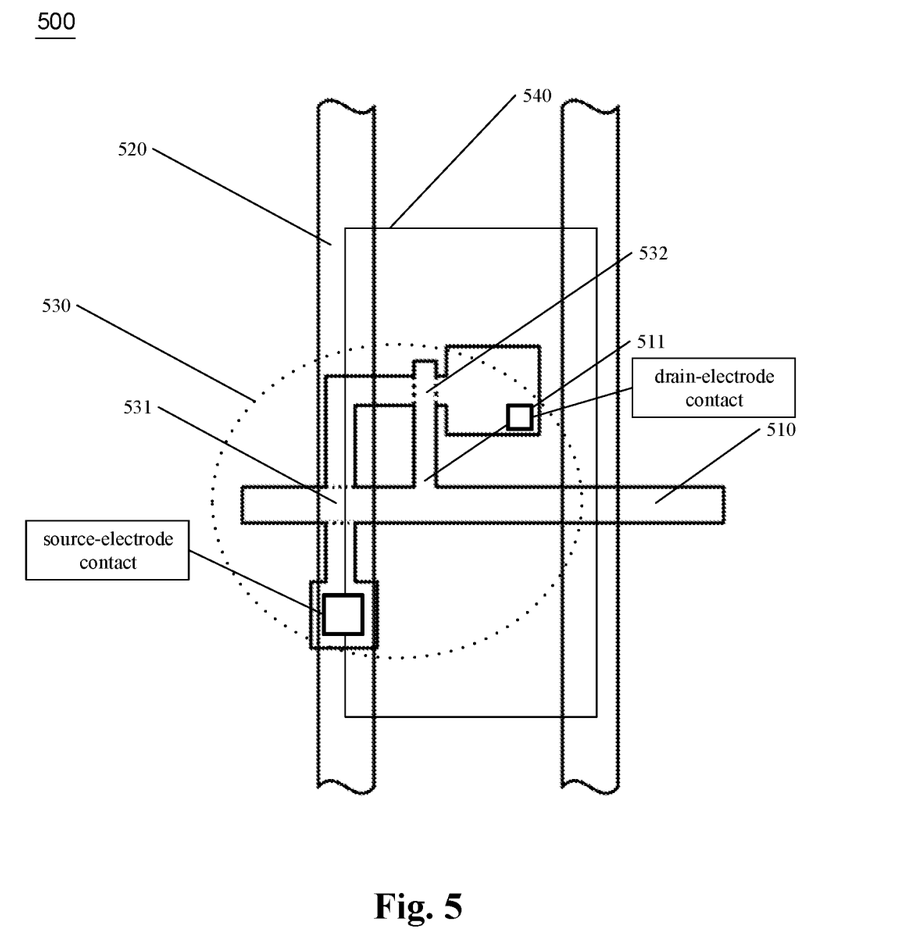
FIG. 5 is a schematic diagram of a pixel structure according to another exemplary embodiment in accordance with the present disclosure.

FIG. 5 is a schematic diagram of a pixel structure according to another exemplary embodiment in accordance with the present disclosure. As shown in FIG. 5, a pixel structure 500 includes a scan line 510, a data line 520, a semiconductor pattern 530 and a transparent pixel electrode 540. Description of the parts in FIG. 5 which are the same as in FIG. 2 will not be repeated.

FIG. 5 differs from FIG. 2 in that the semiconductor pattern 530 contains an L-shaped structure. One side of the L-shaped structure contained in the semiconductor pattern 530 intersects with the scan line 510, and the other side of the L-shaped structure contained in the semiconductor pattern 530 intersects with the branch structure 511. In this regard, the semiconductor pattern 530 includes: a first channel region 531 which corresponds to the scan line 510 and a second channel region 532 which corresponds to the branch structure 511.

Figure 6:
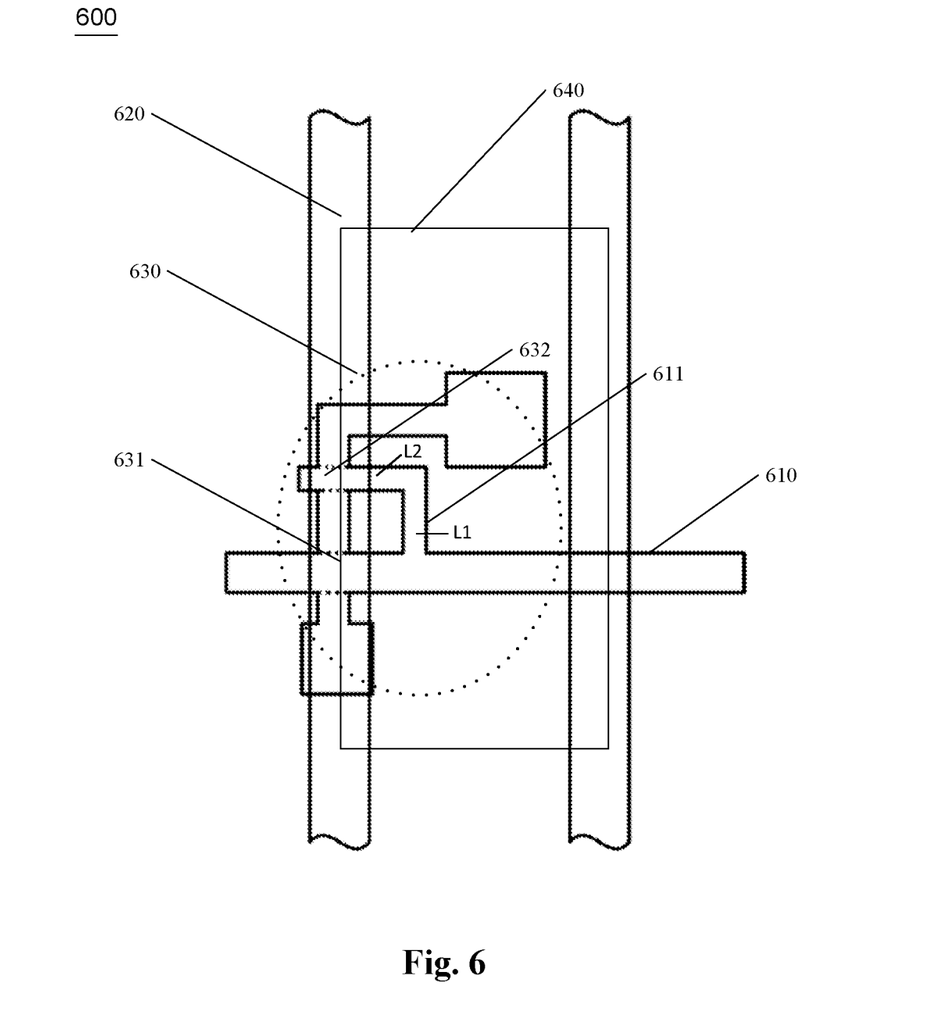
FIG. 6 is a schematic diagram of a pixel structure according to another exemplary embodiment in accordance with the present disclosure.

FIG. 6 is a schematic diagram of a pixel structure according to another exemplary embodiment in accordance with the present disclosure. As shown in FIG. 6, a pixel structure 600 includes a scan line 610, a data line 620, a semiconductor pattern 630 and a transparent pixel electrode 640. Description of the parts in FIG. 6 which are the same as in FIG. 2 will not be repeated.

FIG. 6 differs from FIG. 2 in that a second part L2 of an L-shaped branch structure 611 intersects with a first part L1 of the branch structure 611, and the second part L2 of the L-shaped branch structure 611 intersects with the semiconductor pattern 630. The semiconductor pattern 630 intersects with the scan line 610 and the branch structure 611 respectively. In this regard, the semiconductor pattern 630 includes: a first channel region 631 which corresponds to the scan line 610 and a second channel region 632 which corresponds to the branch structure 611. The first channel region 631 and the second channel region 632 are all below the data line 620. However, the present disclosure is not limited thereto.

Figure 7:
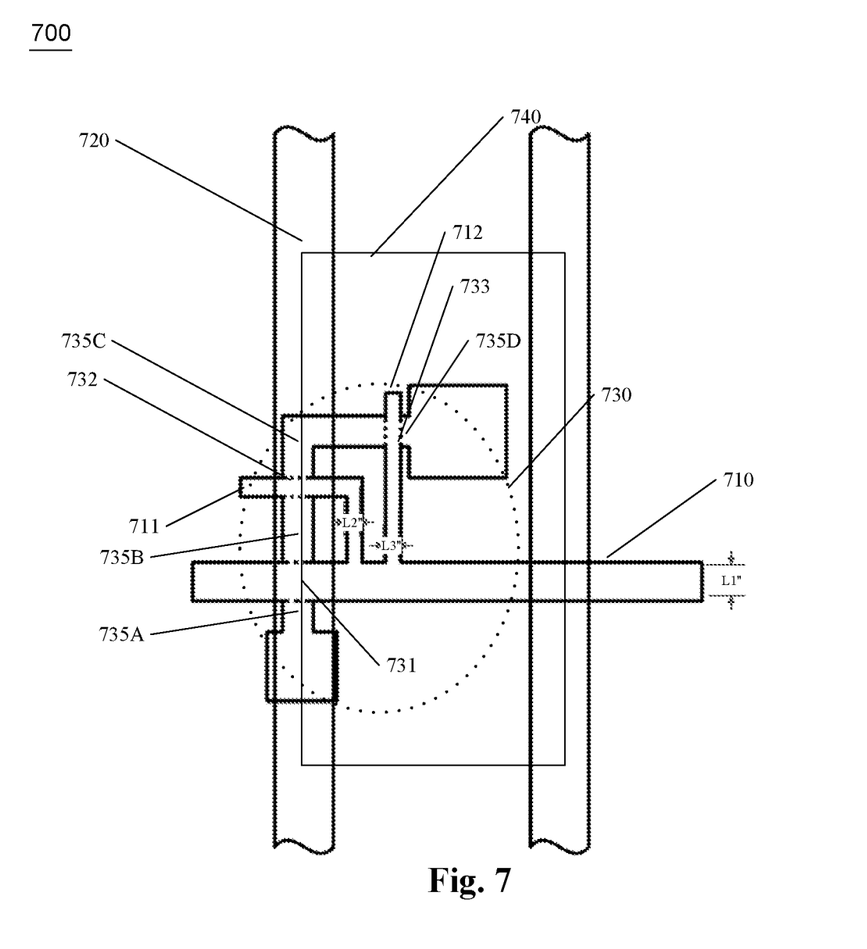
FIG. 7 is a schematic diagram of a pixel structure according to another exemplary embodiment in accordance with the present disclosure.

FIG. 7 is a schematic diagram of a pixel structure according to another exemplary embodiment in accordance with the present disclosure. As shown in FIG. 7, a pixel structure 700 includes a scan line 710, a data line 720, a semiconductor pattern 730 and a transparent pixel electrode 740. Description of the parts in FIG. 7 which are the same as in FIG. 2 will not be repeated.

As shown in FIG. 7, the scan line 710 has branch structures 711 and 712. Each of the branch structure 711 and the branch structure 712 perpendicularly extends from the scan line 710. However, the present disclosure is not limited thereto.

The semiconductor pattern 730 intersects with the scan line 710, the branch structures 711 and 712 respectively. In this regard, the semiconductor pattern 730 includes: a first channel region 731 which corresponds to the scan line 710, a second channel region 732 which corresponds to the branch structure 711, and a third channel region 733 which corresponds to the branch structure 712. Wherein the width of the scan line 710 is the width L1" of the first channel region; the width of the branch structure 711 is the width L2" of the second channel region; the width of the branch structure 712 is the width L3" of the third channel region. Doping regions 735A and 735B are respectively disposed at the two sides of the first channel region 731; doping regions 735B and 735C are respectively disposed at the two sides of the second channel region 732; and doping regions 735C and 735D are respectively disposed at the two sides of the third channel region 733.

As shown in FIG. 7, the first channel region 731, the second channel region 732, the third channel region 733 and the doping regions 735A, 735B, 735C and 735D and the portions of the scan line 710, the branch structure 711 and the branch structure 712 which respectively correspond to the first channel region 731, the second channel region 732 and the third channel region 733, may be configured to form a multi-channel (multi-gate) thin-film transistor 730.

According to the exemplary embodiment, an asymmetric multi-gate structure is provided. For example, as shown in FIG. 7, at least one of the branch structure 711 and the branch structure 712 which respectively intersect with the semiconductor pattern 730 has a width less than a width L1" of the scan line 710. That is to say, at least one of the width L2" of the second channel region 732 and the width L3" of the third channel region 733 is less than the width of the first channel region 731. In this way, the width of at least one channel region may be reduced without changing the width of the scan line. By so doing, the stray capacitance may be reduced and the feed-through voltage may be lowered without increasing gate delay.

Figure 8:
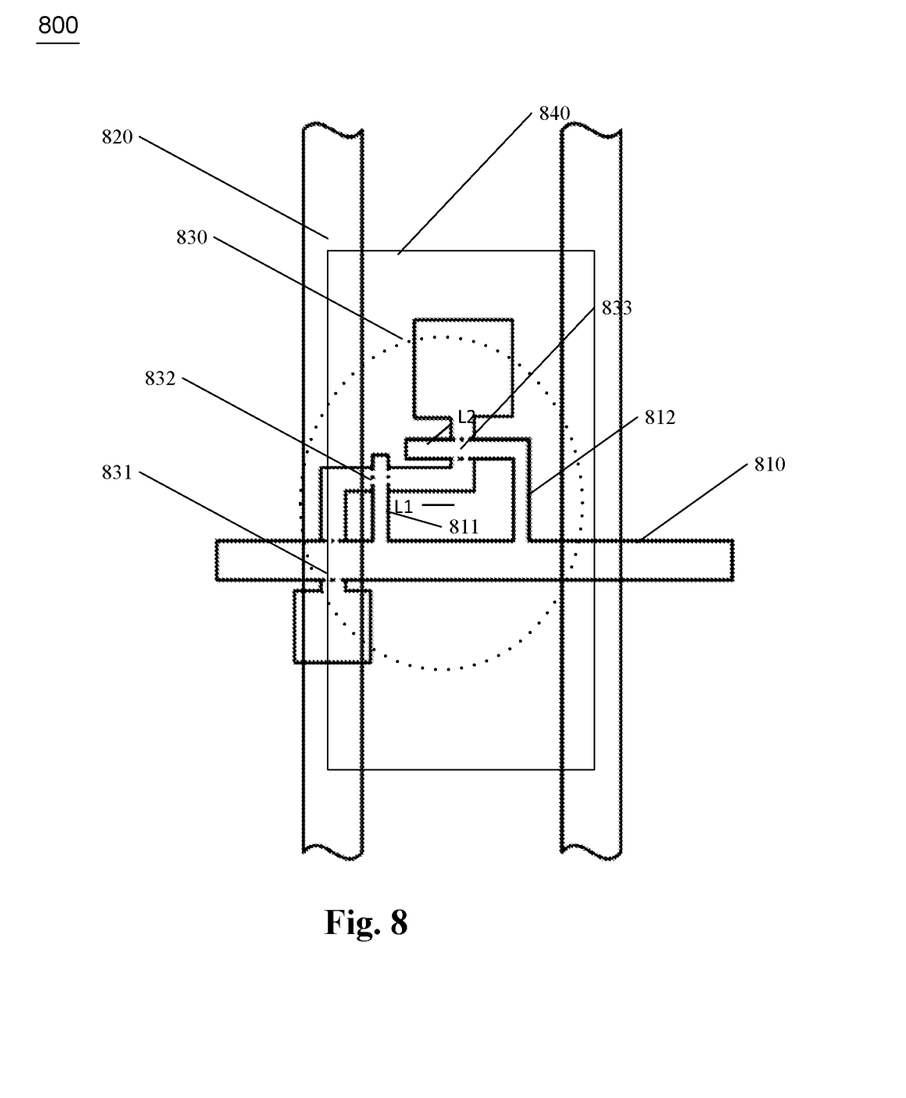
FIG. 8 is a schematic diagram of a pixel structure according to another exemplary embodiment in accordance with the present disclosure.

FIG. 8 is a schematic diagram of a pixel structure according to another exemplary embodiment in accordance with the present disclosure. As shown in FIG. 8, a pixel structure 800 includes a scan line 810, a data line 820, a semiconductor pattern 830 and a transparent pixel electrode 840. Description of the parts in FIG. 8 which are the same as in FIG. 7 will not be repeated.

FIG. 8 differs from FIG. 7 in that the scan line 810 has a branch structure 811 and a branch structure 812. In the embodiment, the branch structure 812 is an L-shaped branch structure, and each of the branch structure 811 and the branch structure 812 extends perpendicularly from the scan line 810. However, the present disclosure is not limited thereto. A second portion L2 of the L-shaped branch structure 812 intersects with a first portion L1 of the branch structure 812. The second portion L2 of the L-shaped branch structure 812 perpendicularly intersects with a linear portion of the semiconductor pattern 830. The semiconductor pattern 830 intersects with the scan line 810, the branch structure 811 and the branch structure 812, respectively. In this regard, the semiconductor pattern 830 includes: a first channel region 831 which corresponds to the scan line 810, a second channel region 832 which corresponds to the branch structure 811, and a third channel region 833 which corresponds to the branch structure 812.

Figure 9:
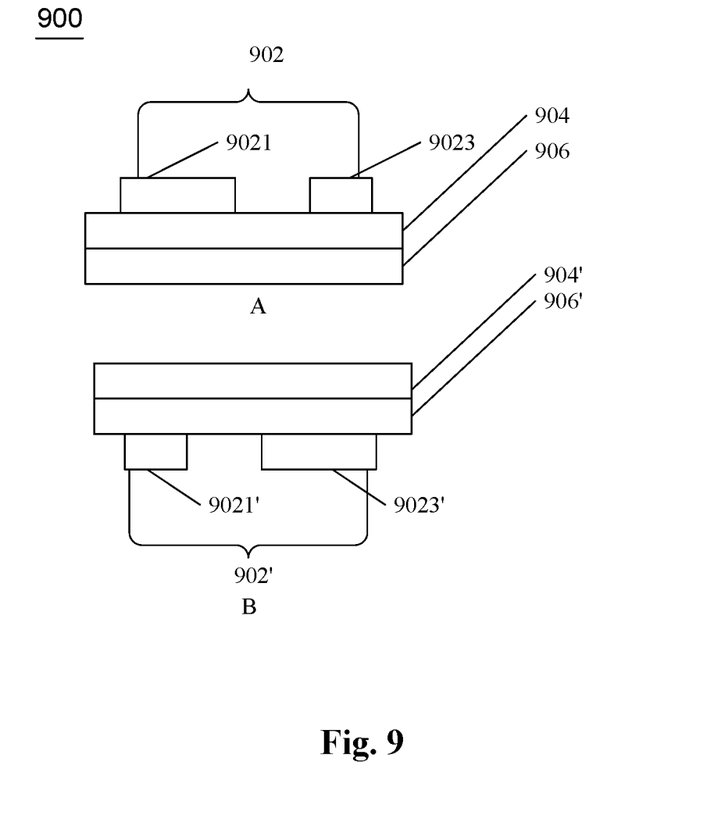
FIG. 9 is a schematic cross sectional view of a pixel structure according to an exemplary embodiment in accordance with the present disclosure.

FIG. 9 is a schematic cross sectional view of a pixel structure according to an exemplary embodiment in accordance with the present disclosure. As shown in FIG. 9A, in the cross sectional view of the pixel, the pixel includes a scan-line layer 902, an insulator layer 904 and an active source layer 906. In an exemplary embodiment, the scan-line layer may include a scan line 9021 and a branch structure 9023 of the scan line. As shown in FIG. 9B, in a cross sectional view of the pixel, the pixel includes a scan-line layer 902', an insulator layer 904' and an active source layer 906'. In an exemplary embodiment, in the cross sectional view, the scan-line layer may also include a scan line 9021' and a branch structure 9023' of the scan line.

Figure 10:
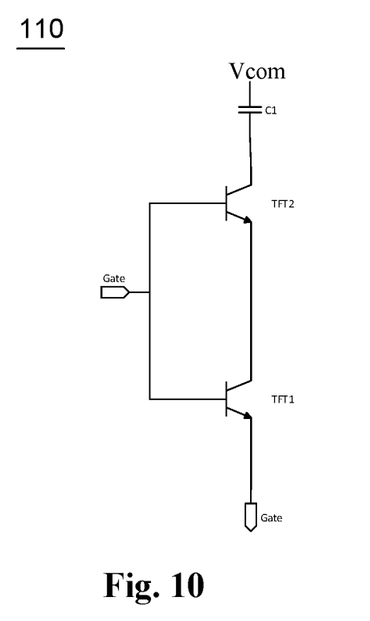
FIG. 10 is a simulation circuit diagram of a pixel structure according to an exemplary embodiment in accordance with the present disclosure.

FIG. 10 is a simulation circuit diagram of a pixel structure according to an exemplary embodiment in accordance with the present disclosure.

As shown in a circuit diagram 100 of FIG. 10, Data is a negative frame voltage, C1 is a pixel storage capacitance, and TFT1 and TFT2 are equivalent circuits formed by the semiconductor circuit in the pixel structure of the present disclosure.

Figure 13:
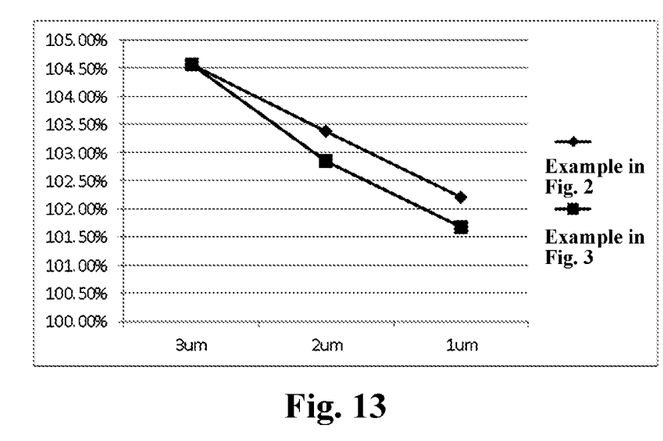
FIG. 13 is a graph of negative-frame charging of a simulation circuit of a pixel as shown in FIGS. 6 and 7 according to an exemplary embodiment in accordance with the present disclosure.

With reference to the example shown in FIG. 2, for example, it may be assumed that a turned-on voltage VGH of the thin film transistor (TFT) is 10V, a turned-off voltage VGL of the thin film transistor (TFT) is −7V, a negative frame voltage Data is −5V, and a pixel storage capacitance is 0.32 fF. The width of the scan line 210, i.e. the width L1 of the first channel region 231 as discussed above is 2 um. The width of the branch structure 211 of the scan line, i.e. the width L2 of the second channel region 232 as discussed above is 3 um, 2 um and 1 um respectively. Results of positive frame voltage simulation in the embodiment of FIG. 6 are as shown in the following table, and as shown in FIG. 13:

| Width of Second Channel | Voltage when fully charged | Voltage after Feed-Through Voltage Loss | Charge Rate |
|---|---|---|---|
| 3 um | 5.00 V | 4.789 V | 95.78% |
| 2 um | 5.00 V | 4.804 V | 96.08% |
| 1 um | 5.00 V | 4.821 V | 96.42% |

Figure 12:
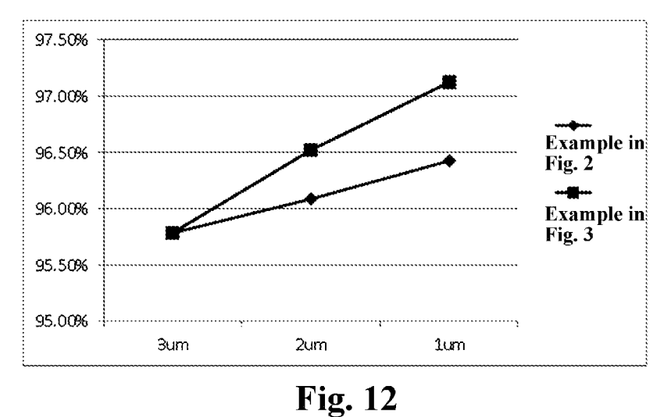
FIG. 12 is a graph of positive-frame charging of a simulation circuit of a pixel as shown in FIGS. 6 and 7 according to an exemplary embodiment in accordance with the present disclosure.

With reference to the example shown in FIG. 3, for example, it may be assumed that a turned-on voltage VGH of the thin film transistor (TFT) is 10V, a turned-off voltage VGL of the thin film transistor (TFT) is −7V, a negative frame voltage Data is −5V, and a pixel storage capacitance is 0.32 fF. The width of the scan line 310, i.e. the width L1' of the first channel region 331 as discussed above is 2 um. The width of the branch structure 311 of the scan line, i.e. the width L2' of the second channel region 332 as discussed above is 3 um, 2 um and 1um respectively. Results of positive frame voltage simulation in the embodiment of FIG. 6 are as shown in the following table, and as shown in FIG. 12:

| Width of Second Channel | Voltage when fully charged | Voltage after Feed-Through Voltage Loss | Charge Rate |
|---|---|---|---|
| 3 um | 5.00 V | 4.789 V | 95.78% |
| 2 um | 5.00 V | 4.826 V | 96.52% |
| 1 um | 5.00 V | 4.856 V | 97.12% |

In positive frame voltage simulation of the pixel structure, the design objective is to reduce a feed-through voltage as far as possible, that is, to make the voltage value after the feed-through voltage loss close to a standard voltage value 5V.

It can be seen from the results, when in the pixel structure, the branch structure of the scan line has a different width of the scan line, it may influence the positive frame charge capacity of the entire pixel. The wider of the branch structure of the scan line, the weaker the charge capability of the entire pixel structure will be, and it means that the resulted voltage after the pixel structure is charged is more deviated from 5V. In the present embodiment, the result of positive frame voltage simulation of such pixel structure, according to the embodiment in which the width of the scan line is larger than the width of branch structure of the scan line (that is, the embodiment in which the width of the first channel region is larger than the width of the second channel region), it can effectively lower the feed-through voltage and it can enhance the charge capability of the device.

Figure 11:
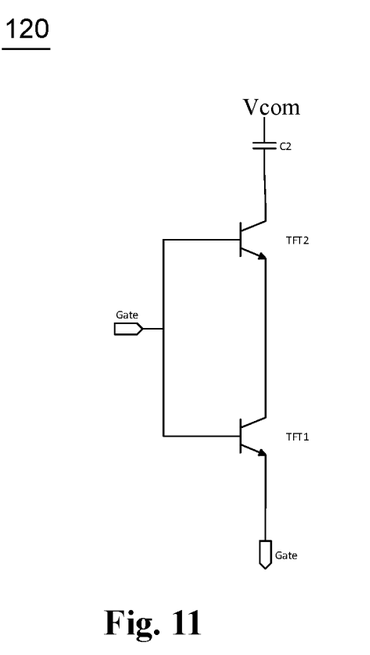
FIG. 11 is a simulation circuit diagram of a pixel structure according to another exemplary embodiment in accordance with the present disclosure.

FIG. 11 is a simulation circuit diagram of another pixel structure according to an exemplary embodiment in accordance with the present disclosure.

In the circuit diagram 120 as shown in FIG. 11, Data is a negative frame voltage, C2 is a pixel storage capacitance, TFT1 and TFT2 are equivalent circuits constituted by the semiconductor circuit in the pixel structure disclosed by the present disclosure.

With reference to the example as shown in FIG. 2, for example, it may be assumed that a turned-on voltage VGH of the thin film transistor (TFT) is 10V, a turned-off voltage VGL of the thin film transistor (TFT) is −7V, a negative frame voltage Data is −5V, and a pixel storage capacitance is 0.32 fF. The width of the scan line 210, i.e. the width L1 of the first channel region 231 as discussed above is 2 um. The width of the branch structure 211 of the scan line, i.e. the width L2 of the second channel region 232 as discussed above is 3 um, 2 um and 1um respectively. Results of negative frame voltage simulation in the embodiment of FIG. 7 are as shown in the following table, and as shown in FIG. 13:

| Width of Second Channel | Voltage when fully charged | Voltage after Feed-Through Voltage Loss | Charge Rate |
|---|---|---|---|
| 3 um | −5.00 | −5.228 | 104.56% |
| 2 um | −5.00 | −5.169 | 103.38% |
| 1 um | −5.00 | −5.110 | 102.20% |

With reference to the example as shown in FIG. 3, for example, it may be assumed that a turned-on voltage VGH of the thin film transistor (TFT) is 10V, a turned-off voltage VGL of the thin film transistor (TFT) is −7V, a negative frame voltage Data is −5V, and a pixel storage capacitance is 32 fF. The width of the scan line 310, i.e. the width L1' of the first channel region 331 as discussed above is 2 um. The width of the branch structure 311 of the scan line, i.e. the width L2' of the second channel region 332 as discussed above is 3 um, 2 um and 1um respectively. Results of negative frame voltage simulation in the embodiment of FIG. 7 are as shown in the following table, and as shown in FIG. 13:

| Width of Second Channel | Voltage when fully charged | Voltage after Feed-Through Voltage Loss | Charge Rate |
| --- | --- | --- | --- |
| 3 um | −5.00 | −5.228 | 104.56% |
| 2 um | −5.00 | −5.142 | 102.84% |
| 1 um | −5.00 | −5.084 | 101.68% |

In negative frame voltage simulation of the pixel structure, the design objective is to reduce a feed-through voltage, that is, to make the voltage value after the feed-through voltage loss close to a standard voltage value −5V.

It can be seen from the results, when in the pixel structure, the branch structure of the scan line has a different width of the scan line. It may influence the negative frame charge capacity of the entire pixel. The wider of the branch structure of the scan line, the weaker the charge capability of the entire pixel structure will be, and it means that the resulted voltage after the pixel structure is charged is more deviated from −5V. In the present embodiment, the result of negative frame voltage simulation of such pixel structure, according to the embodiment in which the width of the scan line is larger than the width of branch structure of the scan line (that is, the embodiment in which the width of the first channel region is larger than the width of the second channel region), it can effectively lower the feed-through voltage and it can enhance the charge capability of the device.

From the above detailed description the pixel structure according to the embodiments of the present disclosure may have one or more of the following advantages.

According to various embodiments in accordance with the present disclosure, the feed-through voltage may be lowered without increasing gate delay. Moreover, the charge capacity of the device may be enhanced, and it may improve the display performance of the display screen.

The exemplary embodiments described in the present disclosure have been illustrated and described in detail as above. It should be understood that, the present disclosure is not limited to the detailed structure, the configuration and implementation described herein. Instead, the present disclosure intends to cover various modifications and equivalents falling within the spirit and scope of the appended claims.

What is claimed is:

1. A pixel structure, comprising:
a pixel electrode;
a data line;
a scan line, having a branch and a main body, wherein the branch is connected vertically with the main body, the main body is intersected with the data line, and an extending direction of the main body is intersected with an extending direction of the branch; and
a semiconductor pattern connected between the data line and the pixel electrode and comprising a first region, a second region, a third region, a fourth region, a first channel region, a second channel region, a source-electrode contact and a drain-electrode contact, wherein the source-electrode contact is connected to the data line and the drain-electrode contact is connected to the pixel electrode, the first channel region is connected between the second channel region and the data line and connected between the source-electrode contact and the second channel region, and the second channel region is connected between the first channel region and the pixel electrode and connected between the drain-electrode contact and the first channel region;
wherein the first channel region is a part of the semiconductor pattern overlapping with the main body, the second channel region is a part of the semiconductor patter overlapping with the branch,
wherein none of the first region, the second region, the third region or the fourth region is overlapped with the scan line;
the first region is connected between the source-electrode contact and the first channel region, the second region is connected between the first channel region and the third region, and the first region and the second region are both connected directly to the first channel region;
wherein the third region is connected between the second region and the second channel region, the fourth region is connected between the second channel region and the drain-electrode contact, and the third region and the fourth region are both connected directly to the second channel region;
wherein the first region, the first channel region and the second region are arranged in a direction intersected with the extending direction of the main body, and the third region, the second channel region and the fourth region are arranged in a direction intersected with the extending direction of the branch;
wherein: a length of the first channel region is a dimension of the first channel region along an arranging direction of the first region, the first channel region and the second region, a width of the main body is a dimension of the main body in a direction perpendicular to its extending direction and along the arranging direction of the first region, the first channel region and the second region, and the length of the first channel region is the same as the width of the main body; and a length of the second channel region is a dimension of the second channel region along an arranging direction of the third region, the second channel region and the fourth region, a width of the branch is a dimension of the branch in a direction perpendicular to its extending direction and along the arranging direction of the third region, the second channel region and the fourth region, and the length of the second channel region is the same as the width of the branch; and
wherein the length of the first channel region is greater than the length of the second channel region.

2. The pixel structure according to claim 1, wherein the length of the second channel region is one fifth to four fifth of the length of the first channel region.

3. The pixel structure according to claim 1, wherein the semiconductor pattern further comprises doping regions, respectively located at two sides of the first channel region and at two sides of the second channel region; the first channel region is connected to the data line through one of the doping regions, and the second channel region is connected to the pixel electrode through one of the doping regions, and wherein the doping regions comprises the first region, the second region, the third region and the fourth region.

4. The pixel structure according to claim 3, wherein the doping regions comprise a first doping region, a second doping region and a third doping region, the first doping region is connected between the data line and the first channel region, the second doping region is connected between the first channel region and the second channel region, and the third doping region is connected between the second channel region and the pixel electrode, and the first doping region, the first channel region, the second doping region, the second channel region, and the third doping region are continuously disposed in the semiconductor pattern, and wherein the first doping region comprise the first region, the second doping region comprises the second region and the third region, and the third doping region comprises the fourth region.

5. The pixel structure according to claim 1, wherein the first channel region is overlapped with the data line; and
the second channel region and the pixel electrode are located at a same side of the data line.

6. The pixel structure according to claim 1, wherein the semiconductor pattern comprises a first portion and a second potion that are connected, the first portion comprises the first channel region, the second portion comprises the second channel region, and an extending direction of the first portion is same as an extending direction of the data line, and an extending direction of the second portion is intersected with the extending direction of the data line.

7. The pixel structure according to claim 1, wherein the width of the main body is greater than the width of the branch.

8. The pixel structure according to claim 1, wherein the branch is strip-shaped, and the extending direction of the branch is perpendicular to the extending direction of the main body.

9. The pixel structure according to claim 6, wherein an approximately rectangular region is jointly defined by the first portion and the second portion of the semiconductor pattern and the main body and the branch of the scan line.

10. The pixel structure according to claim 1, wherein the semiconductor pattern comprises a first end and a second end, the first channel region is connected to the data line through the first end, and the second channel region is connected to the pixel electrode through the second end;
a width of the first end of the semiconductor pattern is greater than a width of the first channel region, and a width of the second end of the semiconductor pattern is greater than a width of the second channel region; and
the widths of the first and second channel regions, the width of the first end and the width of the second end are all dimensions in a direction perpendicular to an extending direction of the semiconductor pattern.

11. The pixel structure according to claim 10, wherein the first end and the second end are respectively located at two sides of the main body of the scan line.

12. The pixel structure according to claim 10, wherein the second end of the semiconductor pattern and the branch of the scan line are located at a same side of the main body of the scan line.

13. The pixel structure according to claim 10, wherein: along the extending direction of the main body, the branch is located between the second end and the data line, and is overlapped with the second end and the data line.

14. The pixel structure according to claim 1, wherein the semiconductor pattern comprises a polysilicon pattern.

15. The pixel structure according to claim 1, further comprising a pixel storage capacitor, and a capacitance value of the pixel storage capacitor is less than 150 fF.

16. The pixel structure according to claim 1, wherein the pixel electrode is a transparent pixel electrode.

17. A display device, comprising a pixel structure;
wherein the pixel structure comprises:
a pixel electrode;
a data line;
a scan line, having a branch and a main body, wherein the branch is connected vertically with the main body, the main body is intersected with the data line, and an extending direction of the main body is intersected with an extending direction of the branch; and
a semiconductor pattern connected between the data line and the pixel electrode and comprising a first region, a second region, a third region, a fourth region, a first channel region, a second channel region, a source-electrode contact and a drain-electrode contact, wherein the source-electrode contact is connected to the data line and the drain-electrode contact is connected to the pixel electrode, the first channel region is connected between the second channel region and the data line and connected between the source-electrode contact and the second channel region, and the second channel region is connected between the first channel region and the pixel electrode and connected between the drain-electrode contact and the first channel region;
wherein the first channel region is a part of the semiconductor pattern overlapping with the main body, the second channel region is a part of the semiconductor patter overlapping with the branch;
wherein none of the first region, the second region, the third region or the fourth region is overlapped with the scan line,
the first region is connected between the source-electrode contact and the first channel region, the second region is connected between the first channel region and the third region, and the first region and the second region are both connected directly to the first channel region;
wherein the third region is connected between the second region and the second channel region, the fourth region is connected between the second channel region and the drain-electrode contact, and the third region and the fourth region are both connected directly to the second channel region;
wherein the first region, the first channel region and the second region are arranged in a direction intersected with the extending direction of the main body, and the third region, the second channel region and the fourth region are arranged in a direction intersected with the extending direction of the branch;
wherein: a length of the first channel region is a dimension of the first channel region along an arranging direction of the first region, the first channel region and the second region, a width of the main body is a dimension of the main body in a direction perpendicular to its extending direction and along the arranging direction of the first region, the first channel region and the second region, and the length of the first channel region is the same as the width of the main body; and a length of the second channel region is a dimension of the second channel region along an arranging direction of the third region, the second channel region and the fourth region, a width of the branch is a dimension of the branch in a direction perpendicular to its extending direction and along the arranging direction of the third region, the second channel region and the fourth region, and the length of the second channel region is the same as the width of the branch; and wherein the length of the first channel region is greater than the length of the second channel region.

\* \* \* \* \*